United States Patent
Saeki (10) Patent No.: US 7,912,167 B2
(45) Date of Patent: Mar. 22, 2011

(54) CLOCK AND DATA RECOVERY CIRCUIT

(75) Inventor: Takanori Saeki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1088 days.

(21) Appl. No.: 11/699,007

(22) Filed: Jan. 29, 2007

(65) Prior Publication Data

US 2007/0177700 A1 Aug. 2, 2007

(30) Foreign Application Priority Data

Feb. 1, 2006 (JP) .................................. 2006-024489

(51) Int. Cl.
*H04L 7/00* (2006.01)

(52) U.S. Cl. ........ 375/355; 375/326; 375/354; 375/373; 375/376

(58) Field of Classification Search .................. 375/355, 375/326, 354, 373, 376
See application file for complete search history.

(56) References Cited

U.S. PATENT DOCUMENTS

| 6,564,359 B2 * | 5/2003 | Saeki | 716/5 |
| 6,753,712 B2 * | 6/2004 | Saeki | 327/165 |
| 7,116,744 B2 | 10/2006 | Saze et al. | |
| 2002/0079938 A1 | 6/2002 | Saeki | |
| 2002/0172304 A1 | 11/2002 | Saze et al. | |

FOREIGN PATENT DOCUMENTS

| EP | 1246388 | 10/2002 |
| JP | 2002-190724 | 7/2002 |

OTHER PUBLICATIONS

German Office Action date Jun. 2, 2008 (English Translation).

* cited by examiner

*Primary Examiner* — Ted M Wang
(74) *Attorney, Agent, or Firm* — McGinn IP Law Group, PLLC (57) ABSTRACT

A clock and data recovery circuit includes a four-phase generation circuit that generates four-phase clock signals with phases thereof being equally spaced by 90 degrees, a first interpolator and a second interpolator, each of which receives two of the clocks with phases thereof separated to each other by 180 degrees, performs phase interpolation, and outputs a signal obtained by the interpolation and a signal with a phase reverse to a phase of the interpolated signal. A four-phase to eight-phase conversion circuit receives the four-phase clocks from the first and second interpolators, buffers the four-phase clock signals output from the first interpolator and the second interpolator and outputs the buffered four-phase clock signals without alteration, and generates four-phase clocks each obtained by interpolation of two of the clock signals with the mutually adjacent phases among the four-phase clock signals output from the first interpolator and the second interpolator.

11 Claims, 6 Drawing Sheets

FIG. 6 REFERENCE CASE

FIG. 7 CONVENTIONAL ART

CLOCK AND DATA RECOVERY CIRCUIT

FIELD OF THE INVENTION

The present invention relates to a clock and data recovery circuit that receives data and extracts a clock signal synchronized with the received data.

BACKGROUND OF THE INVENTION

Figure 5:
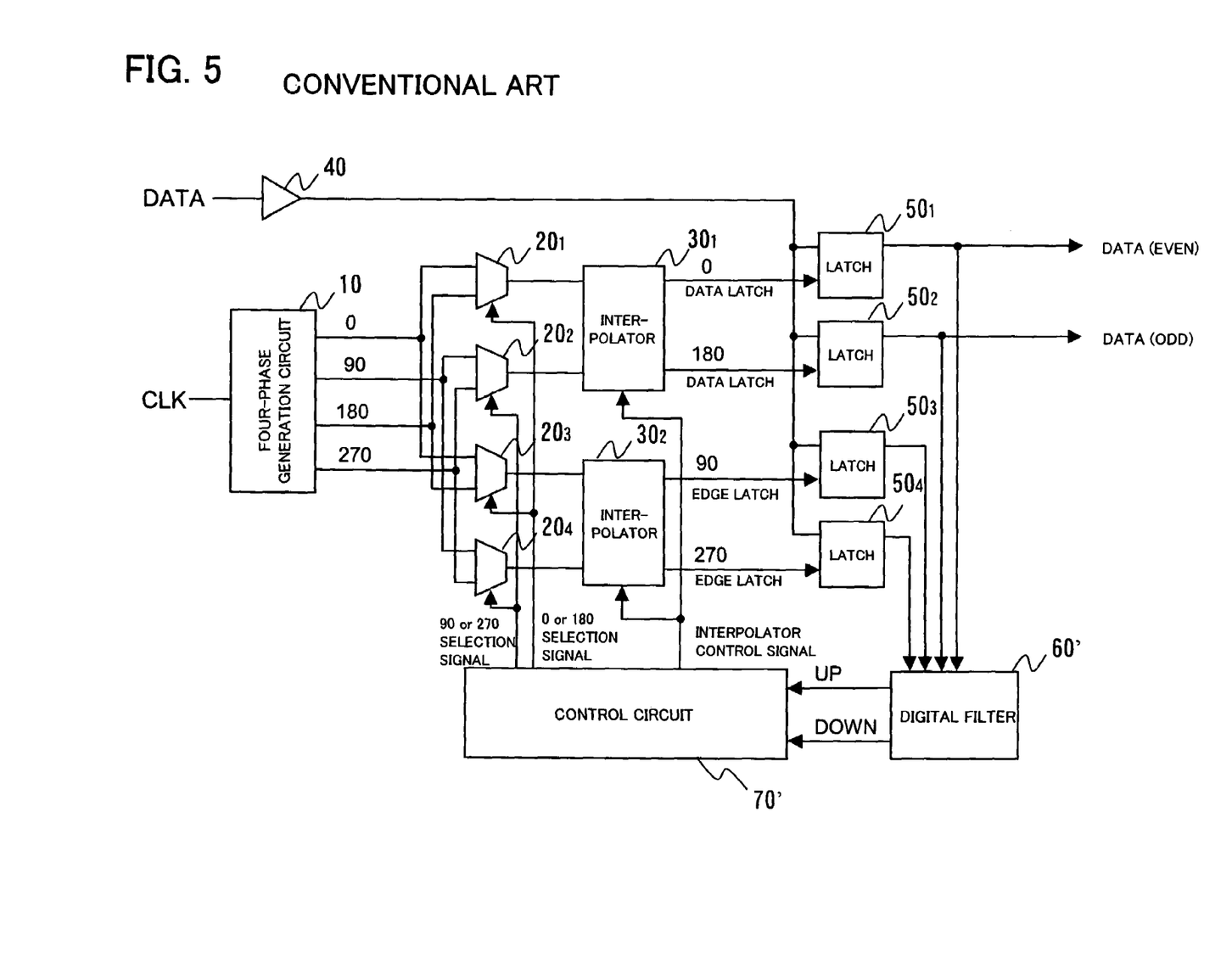
FIG. 5 is a diagram showing an example of a typical configuration of a conventional clock and data recovery circuit.

FIG. 5 is a diagram showing an example of a typical configuration of a clock and data recovery circuit that extracts from received data a clock signal synchronized with the received data and outputs the extracted clock signal and data. Referring to FIG. 5, a four-phase clock generation circuit (abbreviated as a "four-phase generation circuit") 10 receives a clock signal CLK generated by a PLL (Phase Locked Loop) circuit or the like not shown, and generates four-phase clock signals with phases thereof mutually spaced by 90 degrees by frequency division of the clock signal CLK.

A first selector $20_1$ receives the clock signals with phases of 0 and 180 degrees output from the four-phase generation circuit 10, selects one of the clock signals with the phases of 0 and 180 degrees, based on a 0 or 180 selection signal, and outputs the selected signal. A second selector $20_2$ receives the clock signals with phases of 90 and 270 degrees output from the four-phase generation circuit 10, selects one of the clock signals with the phases of 90 and 270 degrees, based on a 90 or 270 selection signal, and outputs the selected signal. A third selector $20_3$ receives the clock signals with the phases of 0 and 180 degrees output from the four-phase generation circuit 10, selects one of the clock signals with the phases of 0 and 180 degrees, based on the 0 or 180 selection signal, and outputs the selected signal. A fourth selector $20_4$ receives the clock signals with the phases of 90 and 270 degrees output from the four-phase generation circuit 10, selects one of the clock signals with the phases of 90 and 270 degrees, based on the 90 or 270 selection signal, and outputs the selected signal A first interpolator $30_1$ receives the outputs of the first selector $20_1$ and the second selector $20_2$ and outputs signals with phases obtained by interpolation of a phase difference between the input two signals according to an interpolator control signal from a control circuit 70', as a 0 data latch clock signal and a 180 data latch clock signal (differential clock signals).

A second interpolator $30_2$ receives the outputs of the third selector $20_3$ and the fourth selector $20_4$ and outputs signals with phases obtained by interpolation of a phase difference between the input two signals according to the interpolator control signal from the control circuit 70', as a 90 edge clock signal and a 270 edge clock signal (differential clock signals).

A receiver 40 receives serial data and outputs the received serial data.

A first latch $50_1$ samples the received serial data at a rising edge of the 0 data latch clock signal from the first interpolator $30_1$, and outputs the sampled data (even data).

A second latch $50_2$ samples the received serial data at a rising edge of the 180 data latch clock signal (clock signal with a phase reverse to the phase of the 0 edge latch clock signal) from the first interpolator $30_1$, and outputs the sampled data (odd data).

A third latch $50_3$ samples the received serial data at a rising edge of the 90 edge latch signal from the second interpolator $30_2$.

A fourth latch $50_4$ samples the received serial data at a rising edge of the 270 edge latch clock signal (clock signal with a phase reverse to the phase of the 90 edge latch clock signal) from the second interpolator $30_2$.

To a digital filter 60', outputs of first through fourth latches $50_1$ through $50_4$ are supplied, and the digital filter 60' outputs an UP signal which is a control signal for advancing the phases or a DOWN signal which is a control signal for delaying the phases, based on a result of filter processing.

Based on the UP or DOWN signal, the control circuit 70' outputs the 0 or 180 selection signal, 90 or 270 selection signal, and interpolator control signal. The 0 or 180 selection signal and the 90 or 270 selection signal cause the second selector $20_2$ and the fourth selector $20_4$ to select 90 degrees from the four-phase generation circuit 10 when the first selector $20_1$ and the third selector $20_3$ selects 0 degrees from the four-phase selection circuit 10. When the first selector $20_1$ and the third selector $20_3$ selects 180 degrees from the four-phase generation circuit 10, the 0 or 180 selection signal and the 90 or 270 selection signal cause the second selector $20_2$ and the fourth selector 204 to select 270 degrees. In other words, assume that in accordance with the UP or DOWN signal, an internal division value (a value x used in internal division of x: 1−x) of the phase difference at each of the interpolators $30_1$ and $30_2$ becomes larger than one or smaller than zero (overflow or underflow) in the control circuit 70' when the first selector $20_1$ and the third selector $20_3$ select the clock signal with a certain phase from the four-phase generation circuit 10 and the second selector $20_2$ and the fourth selector $20_4$ select the clock signal with a certain phase from the four-phase generation circuit 10. Then, the 0 or 180 control signal and the 90 or 270 control signal cause the first selector $20_1$ and the third selector $20_3$ and the second selector $20_2$ and the fourth selector $20_4$ to perform switching to the clock signals with other phases from the fourth-phase generation circuit 10, respectively.

Figure 6:
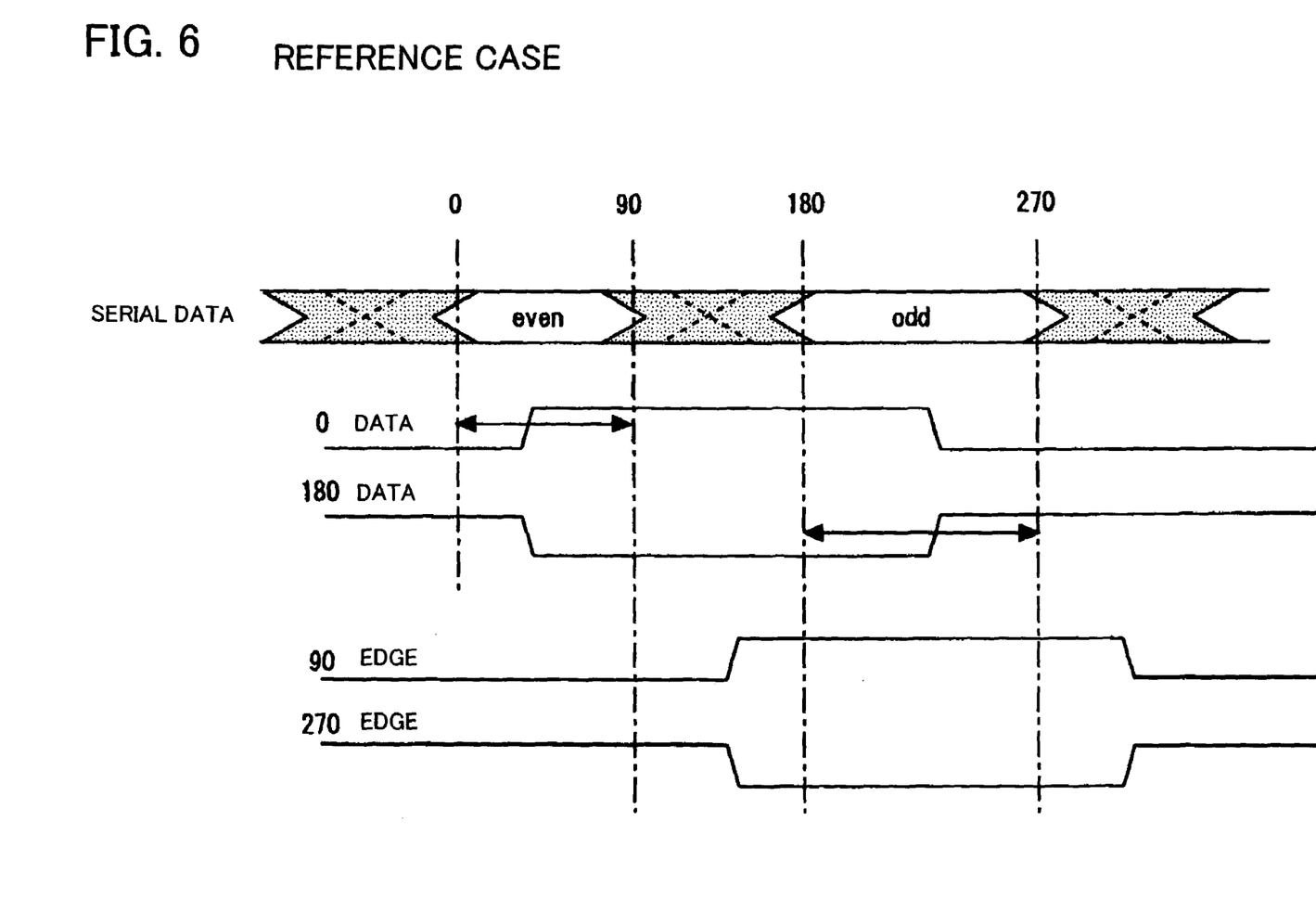
FIG. 6 is a timing waveform diagram showing an example of an operation in FIG. 5.

FIG. 6 is a timing waveform diagram explaining an operation of the circuit in FIG. 5. FIG. 6 illustrates eye patterns. A void portion of each of the even (even) data and the odd (odd) data indicates an eye opening. The serial data in which the even data and the odd data have been multiplexed at a transmission side is supplied to the receiver 40. The even (even) data is sampled by the latch $50_1$ at the rising edge of the clock signal with the phase of zero degrees. The odd (odd) data is sampled by the latch $50_2$ at the rising edge of the clock signal with the phase of 180 degrees (clock signal with the phase reverse to the phase of 0 degrees). Edges of the even data and the odd data are sampled at the rising edges of the clock signals with the phases of 90 and 270 degrees, respectively.

Figure 7:
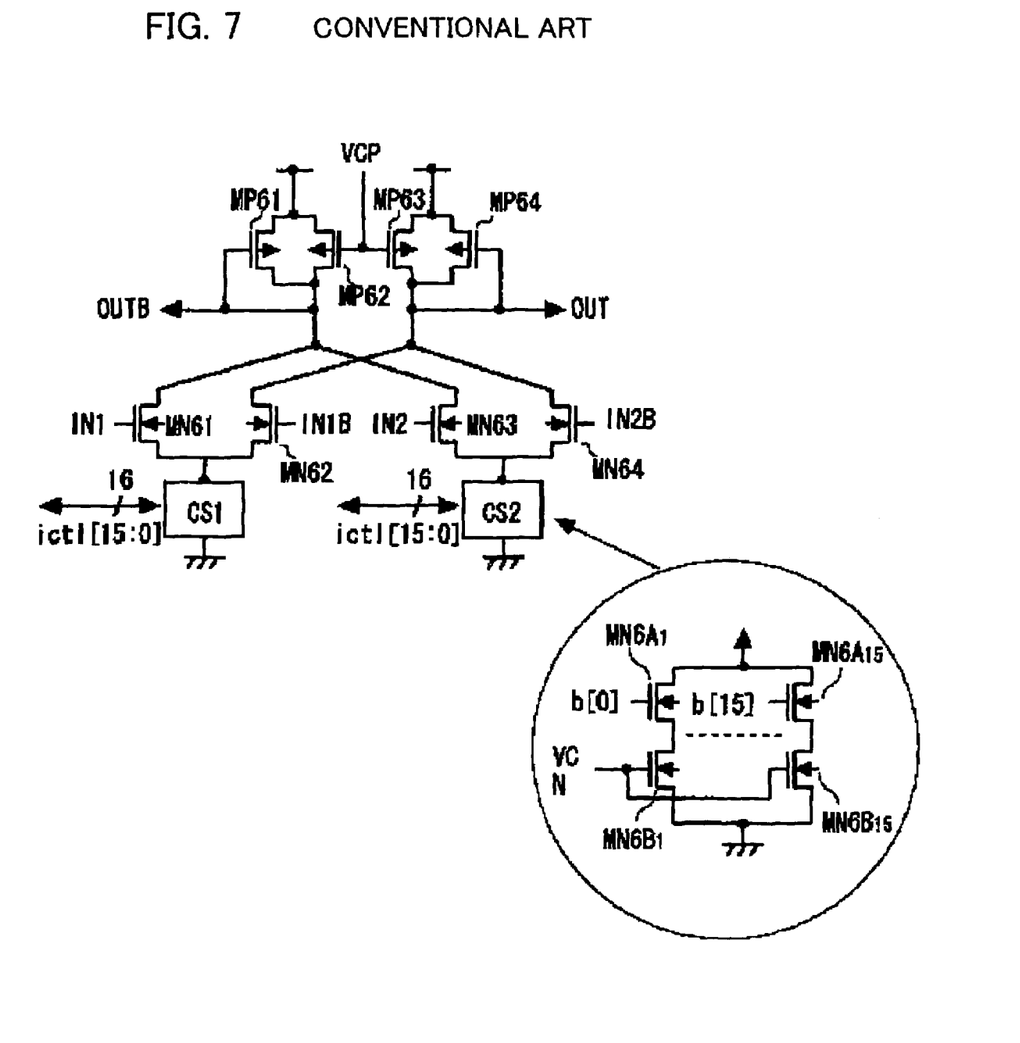
FIG. 7 is a diagram showing an example of an interpolator.

As a clock and data recovery circuit that includes interpolators, a description in Patent Document 1 may be referred to. Each interpolator may be constituted from a differential circuit as shown in FIG. 7, for example (refer to Patent Document 1), in addition to a CMOS circuit (such as those shown in FIGS. 4 and 6 of Patent Document 1). Referring to FIG. 7, this interpolator has a common load circuit. By changing currents that respectively flow through current sources CS1 and CS2 connected to a common source of a first differential pair (MN61, MN62) and a common source of a second differential pair (MN63, MN64), respectively, by a control signal ict1 [15:0], phases of differential output signals OUT and OUTB are variably controlled. The first differential pair receives first differential inputs IN1 and IN1B at gates thereof, respectively. The second differential pair receives second differential inputs IN2 and IN2B at gates thereof, respectively.

[Patent Document 1] JP Patent Kokai Publication No. JP-P2002-190724A (FIGS. 4, 6, and 15)

SUMMARY OF THE DISCLOSURE

In the conventional clock and data recovery circuit described with reference to FIG. 5, the clock signals differentially output from the one interpolator $30_1$ (which are the 0 data latch clock and 180 data latch clock having the phase reverse to the phase of the 0 data latch clock) are employed as the data latch clock signals. That is, the phase of the data latch clock signal is not controlled separately for each of the even data and the odd data.

More specifically, a duty ratio of the even (even) data and a duty ratio of the odd (odd) data are different as shown in FIG. 6, for example (the odd data is longer than the even data). However, sampling of the odd (odd) data is performed at a phase 180 degrees apart from a sampling position of the even (even) data. That is, a sampling timing of the odd (odd) data is controlled, depending on a sampling timing of the even (even) data.

As described above, in the case of the clock and data recovery circuit having the configuration shown in FIG. 5, the phase of the data latch clock signal cannot be controlled independently for each of the even data and the odd data, according to the eye opening of the even data or the odd data of which the duty ratio has deteriorated.

When the data latch clock signals for the even data and the odd data are to be controlled separately at the clock and data recovery circuit shown in FIG. 5, the number of the interpolators that variably control phase shift amounts according to the control signal from the control circuit 70' may increase, leading to an increase in the size of the circuit.

In order to the problems described before, the invention disclosed in this application is schematically configured as follows.

A clock and data recovery circuit according to one aspect of the present invention includes:

a plurality of interpolators each of which outputs a clock signal with a phase obtained by interpolating a phase difference between two input clock signals; and a conversion circuit which outputs a plurality of clock signals (referred to as "a second set of clock signals") obtained by dividing mutually adjacent phases of clock signals (referred to as "a first set of clock signals") output from the interpolators;

the first set of clock signals being used for one of input data detection and edge detection, and the second set of clock signals being used for the other of the input data detection and the edge detection.

A clock and data recovery circuit according to the present invention includes:

a circuit which generates 2N-phase clock signals with phases thereof separated to each other by 180/N degrees; and N interpolators each of which receives from among the 2N-phase clock signals two of the clock signals with phases thereof separated by (360/N) degrees, performs phase interpolation, and outputs a signal obtained by the interpolation and a signal having a phase reverse to a phase of the signal obtained by the interpolation;

2N-phase clock signals with phases thereof interpolated being output from the N interpolators.

The clock and data recovery circuit includes:

a 2N-phase to 4N-phase conversion circuit which buffers the 2N-phase clock signals from the N interpolators and then outputs the buffered 2N-phase clock signals without alteration, and outputs 2N-phase clock signals each having a phase intermediate between the mutually adjacent phases of two of the 2N-phase clock signals output from the N interpolators, thereby outputting a total of 4N-phase clock signals;

a set of the 2N-phase clock signals among the 4N-phase signals output from the 2N-phase 4N-phase conversion circuit being used for input data detection and the remaining 2N-phase clock signals being used for edge detection.

In the present invention, the set of the 2N-phase clock signals is used for the data detection of serial data, and the other 2N-phase clock signals are used for edge detection of the serial data, the serial data having even and odd data multiplexed therein.

The present invention may include:

a four-phase clock generation circuit which generates clock signals of four phases, the four phases being separated to each other by 90 degrees;

first and second interpolators each of which receives from among the four-phase clocks from the four-phase clock generation circuit two of the clock signals with phases thereof separated by 180 degrees, performs phase interpolation, and outputs a signal obtained by the interpolation and a signal with a phase reverse to a phase of the signal obtained by the interpolation; and a four phase-to eight-phase conversion circuit which inputs the four-phase clock signals from the first and second interpolators, buffers the four-phase clock signals from the first and second interpolators and outputs the buffered four-phase clock signals without alteration, and generates four-phase clock signals obtained by interpolating two of the clock signals having the mutually adjacent phases among the four-phase clock signals output from the first and second interpolators, thereby outputting eight-phase clock signals;

a set of the four-phase clock signals among the eight-phase clock signals from the four-phase to eight-phase conversion circuit being used for data detection of serial data and the remaining four-phase clock signals being used for edge detection of the serial data, the serial data having even data and odd data multiplexed therein, for transfer.

The present invention may include:

a control circuit which controls each of phase interpolating amounts of the first and second interpolators separately;

duty ratio correction being thereby separately allowed in response to respective changes in duty ratios of the even data and the odd data.

In the present invention, the four-phase to eight-phase conversion circuit includes:

first through fourth buffer circuits which buffer the four-phase clock signals from the first and second interpolators and output the buffered four-phase clock signals without alteration, respectively; and first through fourth timing division circuits which generate the clock signals each obtained by equally dividing a timing difference between the two clock signals having the mutually adjacent phases among the four-phase clock signals from the first and second interpolators.

In the present invention, the first through fourth buffer circuits which buffer and output the four-phase clock signals from the first and second interpolators without alteration, respectively, may be constituted from fifth through eighth timing division circuits, respectively, the fifth through eighth timing division circuits receiving the four-phase clock signals from the first and second interpolator, respectively, at respective two input terminals thereof in common.

The present invention may include:

a first selector which receives from among the four-phase clock signals from the four-phase clock generation circuit the clock signals with the first phase and the third phase, and selects one of the clock signals with the first phase and the third phase based on a first selection signal, for supply to a first input of the first interpolator;

a second selector which receives from among the four-phase clock signals from the four-phase clock generation circuit the clock signals with the second phase and the fourth phase, and selects one of the clock signals with the second phase and the four phase based on a second selection signal, for supply to a second input of the first interpolator;

a third selector which receives from among the four-phase clock signals from the four-phase clock generation circuit the clock signals with the first phase and the third phase, and selects one of the clock signals with the first phase and the third phase based on the first selection signal, for supply to a first input of the second interpolator; and a fourth selector which receives from among the four-phase clock signals from the four-phase clock generation circuit the clock signals with the second phase and the fourth phase, and selects one of the clock signals with the second phase and the fourth phase based on the first selection signal, for supply to a second input of the second interpolator.

The meritorious effects of the present invention are summarized as follows.

The present invention includes the circuit which generates clocks each obtained by dividing the adjacent phases of the two of clocks interpolated by the plurality of interpolators. The clock signals interpolated by the interpolators are used for one of the input data detection and the edge detection, without alteration, and the phase-divided clock signals are used for the other of the input data detection and the edge detection. Duty ratio correction can be thereby performed separately, in response to respective duty ratio changes in the even data and the odd data. The present invention having the configuration described above is able to suppress an increase in the circuit size.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EMBODIMENTS OF THE INVENTION

In order to describe the present invention described above in further detail, a description will be given with reference to appended drawings. The present invention includes interpolators and a 2N-phase to 4N-phase conversion circuit. Each of the interpolators interpolates phases of two clock signals among 2N-phase clock signals with phases thereof separated to each other by 360/2N degrees, thereby generating clock signals of 2N phases each with a desired phase. The 2N-phase to 4N-phase conversion circuit generates a total of 4N clock signals constituted from 2N clock signals obtained by interpolating two clock signals with the mutually adjacent phases among the clock signals of 2N phases and the 2N clock signals obtained by buffering the clock signals of 2N phases from the interpolators without alteration. Among the clock signals of 4N phases output from the 2N-phase to 4N-phase conversion circuit, the clock signals of 2N phases are used for data detection of received serial data (with even data and odd data multiplexed therein, for transfer), and the remaining clock signals of 2N phases are used for edge detection. According to the present invention, offset adjustment with respect to the phases of the 2N-phase clock signals for data latching can be performed separately, for the even data and the odd data. For this reason, phase adjustment can be performed in accordance with duty ratio deviation of the serial data. A description will be given below in connection with an example. Incidentally, an example where the present invention has been applied to four-phase clock signals described with reference to FIG. 3 will be described below.

FIRST EXAMPLE

Figure 1:
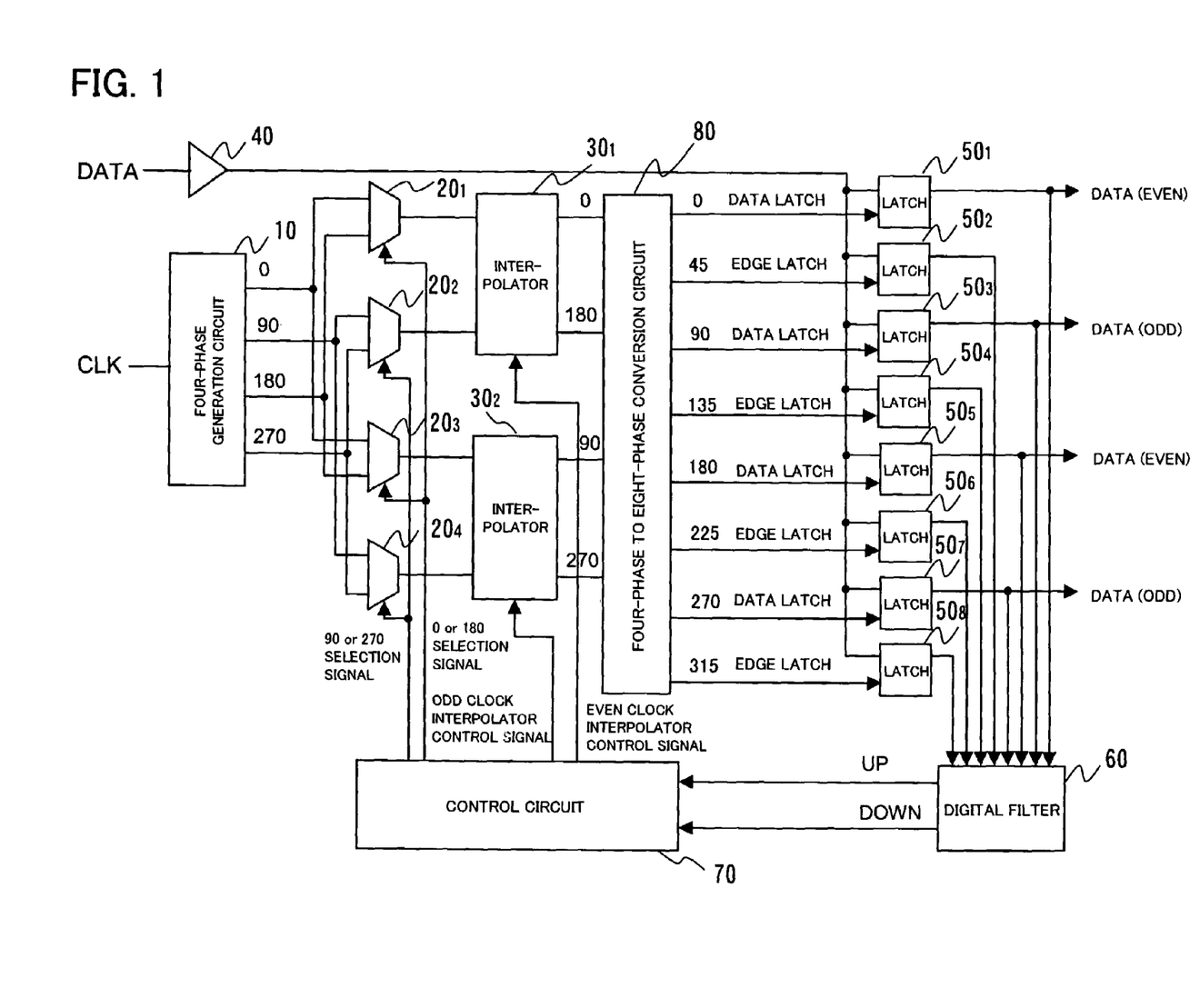
FIG. 1 is a diagram showing a configuration of an example of the present invention.

FIG. 1 is a diagram showing a configuration of an example of the present invention. Referring to FIG. 1, a four-phase generation circuit 10 in this example receives a clock signal CLK generated by a PLL (Phase Locked Loop) circuit not shown or the like, frequency divides the clock signal CLK or the like, and generates four-phase clock signals with phases thereof separated to each other by 90 degrees.

A first selector $20_1$ receives the clock signals with phases of 0 and 180 degrees output from the four-phase generation circuit 10, selects one of the clock signals with the phases of 0 and 180 degrees, based on a 0 or 180 selection signal, and outputs the selected signal. A second selector $20_2$ receives the clock signals with phases of 90 and 270 degrees output from the four-phase generation circuit 10, selects one of the clock signals with the phases of 90 and 270 degrees, based on a 90 or 270 selection signal, and outputs the selected signal. A third selector $20_3$ receives the clock signals with the phases of 0 and 180 degrees output from the four-phase generation circuit 10, selects one of the clock signals with the phases of 0 and 180 degrees, based on the 0 or 180 selection signal, and outputs the selected signal. A fourth selector $20_4$ receives the clock signals with the phases of 90 and 270 degrees output from the four-phase generation circuit 10, selects one of the clock signals with the phases of 90 and 270 degrees, based on the 90 or 270 selection signal, and outputs the selected signal A first interpolator $30_1$ receives the outputs of the first selector $20_1$ and the second selector $20_2$ and outputs signals with phases, obtained by interpolation of a phase difference between the input two signals according to an even clock signal interpolator control signal from a control circuit 70, as a 0 data latch clock signal and a 180 data latch clock signal (differential clock signals).

A second interpolator $30_2$ receives the outputs of the third selector $20_3$ and the fourth selector $20_4$ and outputs signals with phases, obtained by interpolation of a phase difference between the input two signals according to an odd clock signal interpolator control signal from the control circuit 70, as a 90 edge clock signal and a 270 edge clock signal (differential clock signals).

A four-phase to eight-phase conversion circuit 80 receives the outputs of the first interpolator 30$_1$ (clock signals with phases of 0 and 180 degrees) and the outputs of the second interpolator 30$_2$ (clock signals with phases of 90 and 270 degrees), and outputs the clock signals with the four phases (of 0 and 180 degrees and 90 and 270 degrees) from the first and second interpolators 30$_1$ and 30$_2$ without alteration through buffers, respectively. Further, the four-phase to eight-phase conversion circuit 80 generates clock signals with phases of 45 degrees, 135 degrees, 225 degrees, and 315 degrees (referred to as a 45 edge latch clock signal, a 135 edge latch clock signal, a 225 edge latch clock signal, and a 315 edge latch clock signal, respectively). The four-phase to eight-phase conversion circuit 80 generates the 45 edge latch clock signal from the clock signals with the phases of 0 and 90 degrees output from the first interpolator 30$_1$ and the second interpolator 30$_2$, respectively. The four-phase to eight-phase conversion circuit 80 generates the 135 edge latch clock signal from the clock signals with the phases of 90 and 180 degrees output from the second interpolator 30$_2$ and the first interpolator 30$_1$, respectively. The four-phase to eight-phase conversion circuit 80 generates the 225 edge latch clock signal from the clock signals with the phases of 180 and 270 degrees output from the first interpolator 30$_1$ and the second interpolator 30$_2$, respectively. The four-phase to eight-phase conversion circuit 80 generates the 315 edge latch clock signal from the clock signals of with the phases of 270 and 360 degrees (corresponding to 0 degrees in a cycle subsequent to output of the clock signal with the phase of 270 degrees) output from the second interpolator 30$_2$ and the first interpolator 30$_1$, respectively. With this arrangement, the four-phase to eight-phase conversion circuit 80 outputs the clock signals with eight phases.

A first latch 50$_1$ latches received serial data at a rising edge of the 0 data latch clock signal, and outputs the latched data (even data).

A third latch 50$_3$ latches the received serial data at a rising edge of the 90 data latch clock signal, and outputs the latched data (odd data).

A fifth latch 50$_5$ latches the received serial data at a rising edge of the 180 data latch clock signal, and outputs the latched data (even data).

A seventh latch 50$_7$ latches the received serial data at a rising edge of the 270 data latch clock signal, and outputs the latched data (odd data).

A second latch 50$_2$ latches the received serial data at a rising edge of the 45 edge latch clock signal, and outputs the latched result (result of edge detection).

A fourth latch 50$_4$ latches the received serial data at a rising edge of the 135 edge latch clock signal, and outputs the latched result (result of edge detection).

A sixth latch 50$_6$ latches the received serial data at a rising edge of the 225 edge latch clock signal, and outputs the latched result (result of edge detection).

An eighth latch 50$_8$ latches the received serial data at a rising edge of the 315 edge latch clock signal, and outputs the latched result (result of edge detection).

Outputs of the first through eighth latches 50$_1$ to 50$_8$ are supplied to a digital filter 60. The digital filter 60 outputs an UP or DOWN signal based on a result of filter processing.

The control circuit 70 outputs the 0 or 180 selection signal, 90 or 270 selection signal, even interpolator control signal, and odd interpolator signal, based on the UP or DOWN signal.

This example uses the two interpolators 30$_1$ and 30$_2$ for generating the four-phase clock signals for sampling even-numbered and odd-numbered data of the serial data, and derives edge detection by division of a phase difference between the clock signals with the mutually adjacent phases among the four-phase clock signals interpolated by the interpolators.

Figure 2:
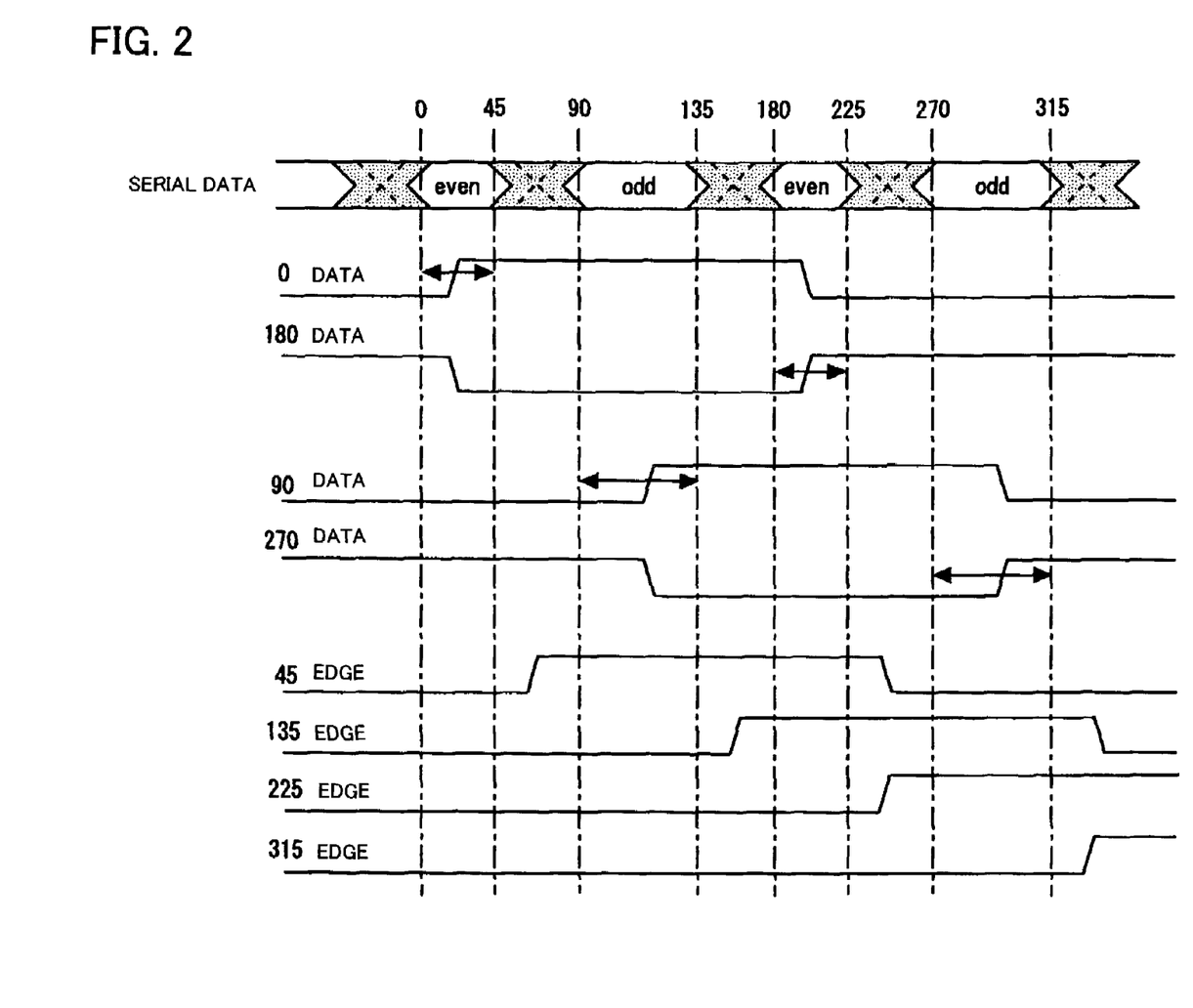
FIG. 2 is a timing waveform diagram showing an example of an operation of the example of the present invention.

FIG. 2 is a timing waveform diagram showing an example of an operation of the configuration in FIG. 1. FIG. 2 illustrates eye patterns, and a void portion of each of even (even) data and odd (odd) data indicates an eye opening. The even data is latched at a rising edge of the zero data latch clock signal. The odd data is latched at a rising edge of the 90 data latch clock signal. The next even data is latched at a rising edge of the 180 data latch clock signal. The next odd data is latched at a rising edge of the 270 data latch clock signal. Edges of the even and odd data are latched at rising edges of the 45 edge latch clock signal, 135 edge latch clock signal, 225 edge latch clock signal, and 315 edge latch clock signal, respectively.

According to this example, the eight-phase clocks are generated from the four-phase clocks. Then, the data and edges of the serial data are sampled. The operation is performed at a transfer rate for the serial data which is twice the transfer rate of a configuration in FIG. 5.

Further, according to this example, the clock signals for edge detection are generated by interpolation of the outputs of the interpolators that generate the data latch clock signals. The four-phase clock signals output from the two interpolators 30$_1$ and 30$_2$ can be used as the data latch clock signals. By assigning sampling of the even data to the clock signals (with the phases of 0 and 180 degrees) output from the interpolator 30$_1$ and assigning sampling of the odd data to the clock signals (with the phases of 90 and 270 degrees) output from the interpolator 30$_2$, for example, sampling phases of the even data and the odd data can be controlled separately. Duty ratios of the even and odd data greatly differ in the example shown in FIG. 2. In this example, the phases of the data latch clock signals with the phases of 0 and 90 degrees, for example, can be controlled separately. For this reason, according to this example, appropriate duty ratio correction can be performed against variations in the duty ratios of the even and odd data.

An arbitrary configuration may be employed for the four-phase to eight-phase conversion circuit 80 in this example if the configuration buffers the four-phase clock signals with the phases of 0, 90, 180, and 270 degrees from the first interpolator 30$_1$ and the second interpolator 30$_2$ and outputs the four-phase clock signals with alteration, and generates the clock signals each by dividing a phase difference between the clock signals with the mutually adjacent phases among the four-phase clock signals.

Figure 3:
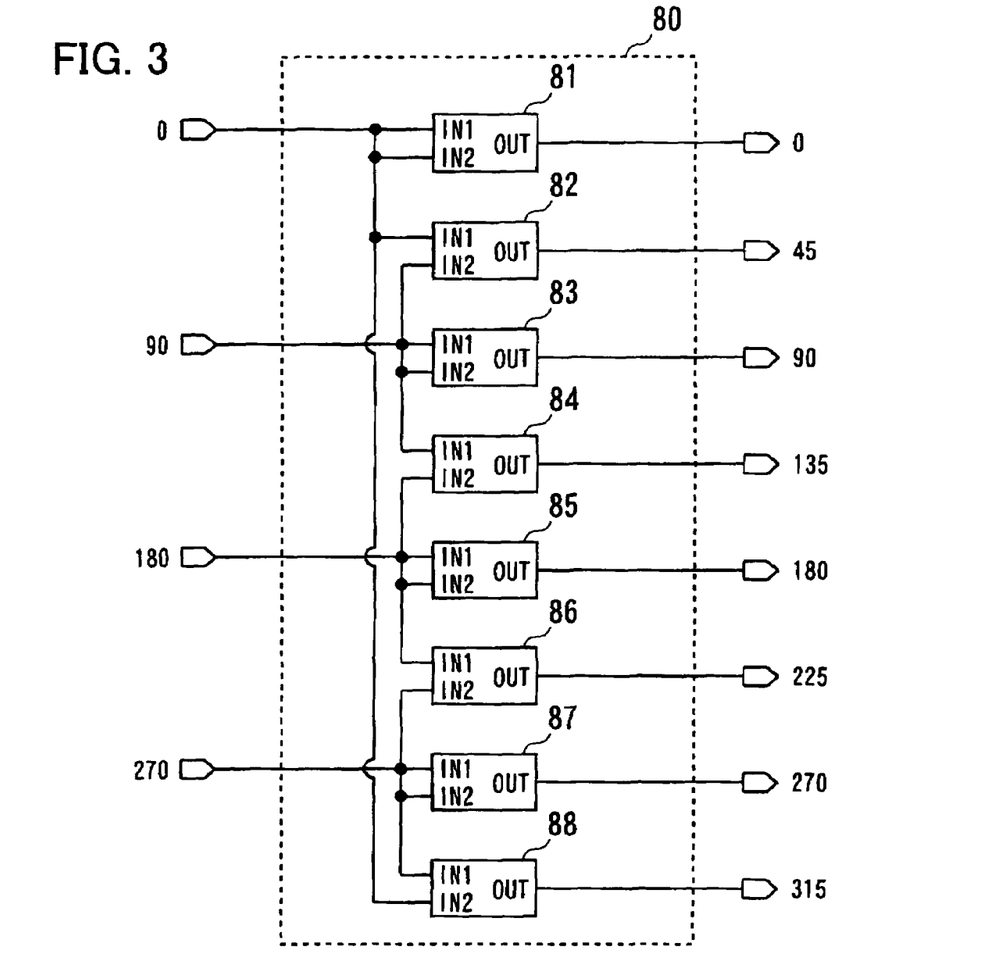
FIG. 3 is a diagram showing an example of a configuration of a four-phase to eight-phase conversion circuit in FIG. 1.

FIG. 3 is a diagram showing an example of the configuration of the four-phase to eight-phase conversion circuit 80, which is constituted from eight timing difference division circuits 81 to 88. The timing difference division circuits 81, 83, 85, and 87 receive the four-phase clock signals from the first interpolator 30$_1$ and the second interpolator 30$_2$, respectively. The timing difference division circuit 81 receives the clock signal with the phase of 0 degrees from the first interpolator 30$_1$ at two inputs IN1 and IN2 thereof in common, and outputs the clock signal with the phase of 0 degrees. The timing difference division circuit 83 receives the clock signal with the phase of 90 degrees from the second interpolator 30$_2$ at two inputs IN1 and IN2 thereof in common, and outputs the clock signal with the phase of 90 degrees. The timing difference division circuit 85 receives the clock signal with the phase of 180 degrees from the first interpolator 30$_1$ at two inputs IN1 and IN2 thereof in common, and outputs the clock signal with the phase of 180 degrees. The timing difference division circuit 87 receives the clock signal with the phase of 270 degrees from the second interpolator $30_2$ at two inputs IN1 and IN2 thereof in common, and outputs the clock signal with the phase of 270 degrees. The timing difference division circuit 82 receives the signals with the phases of 0 and 90 degrees from the first interpolator $30_1$ and the second interpolator $30_2$, respectively, at two inputs IN1 and IN2 thereof, and outputs the clock signal with the phase of 45 degrees obtained by equally dividing the phase difference between the two inputs. The timing difference division circuit 84 receives the signals with the phases of 90 and 180 degrees from the second interpolator $30_2$ and the first interpolator $30_1$, respectively, at two inputs IN1 and IN2 thereof, and outputs the clock signal with the phase of 135 degrees obtained by equally dividing the phase difference between the two inputs. The timing difference division circuit 86 receives the signals with the phases of 180 and 270 degrees from the first interpolator $30_1$ and the second interpolator $30_2$, respectively, at two inputs IN1 and IN2 thereof, and outputs the clock signal with the phase of 225 degrees obtained by equally dividing the phase difference between the two inputs. The timing difference division circuit 88 receives the signals with the phases of 270 and 360 degrees from the second interpolator $30_2$ and the first interpolator $30_1$, respectively, at two inputs IN1 and IN2 thereof, and outputs the clock signal with the phase of 315 degrees obtained by equally dividing the phase difference between the two inputs. An arbitrary configuration may be employed for each of the timing difference division circuits 81 to 88 if the configuration generates an output signal having a phase obtained by dividing a phase difference between two input signals.

Figure 4:
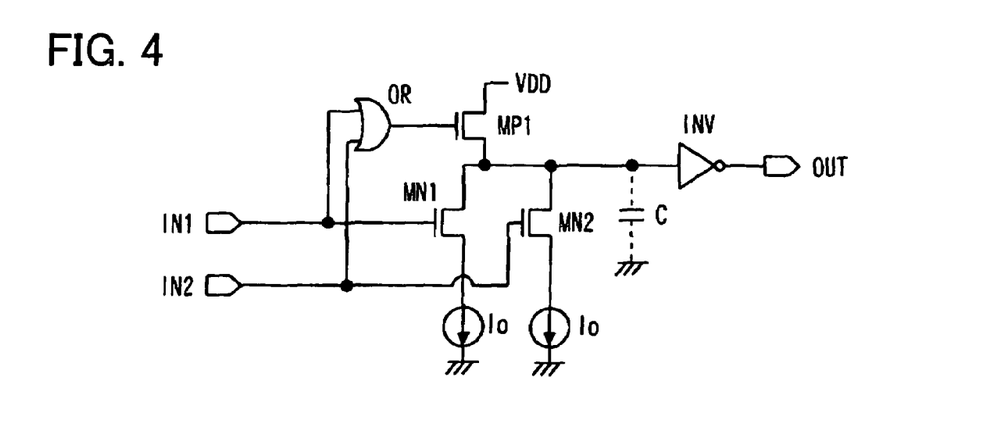
FIG. 4 is a diagram showing an example of a configuration of a timing difference division circuit in FIG. 3.

FIG. 4 is a diagram showing an example of the configuration of each of the timing difference division circuits 81 to 88 in FIG. 3, which is constituted by a CMOS. Referring to FIG. 4, the timing difference division circuit includes an OR circuit, a PMOS transistor MP1, NMOS transistors MN1 and MN2, and an inverter INV. The OR circuit inputs the inputs IN1 and IN2. A source of the PMOS transistor MP1 is connected to a power supply VDD, and a gate of the PMOS transistor MP1 is connected to an output of the OR circuit. Sources of the NMOS transistors MN1 and MN2 are connected to a GND through constant currents $I_0$, respectively. Drains of the NMOS transistors MN1 and MN2 are connected in common to a drain of the PMOS transistor MP1. Gates of the NMOS transistors MN1 and MN2 are connected to the inputs IN1 and IN2, respectively. An input to the inverter INV is connected to a common connecting point among the drain of the PMOS transistor MP1 and the drains of the NMOS transistor MN1 and MN2. An outline of an operation of this circuit will be described below.

When both of the inputs IN1 and IN2 are LOW, the output of the OR circuit goes LOW. Then, the PMOS transistor MP1 turns on, and a power supply potential VDD is applied to the inverter INV (or a capacitance C is charged by the potential VDD). Then, an output of the inverter INV becomes LOW. When the input IN1 transitions to HIGH in this state, for example, the PMOS transistor MP1 turns off, and an electric charge stored in the capacitance C at an input end of the inverter INV is discharged by the current $I_0$. When the input IN2 transitions to HIGH after the input IN1 has transitioned to HIGH, the electric charge stored in the capacitance C is discharged by a current $2I_0$. When a potential at the input end of the inverter INV (a terminal voltage of the capacitance C) becomes below a threshold value of the inverter INV, the output of the inverter INV1 transitions to HIGH. A timing of rising of the output of the inverter INV when the input IN2 rises after a time T from rising of the input IN1 is positioned intermediate between a timing of rising of the output of the inverter INV when the input IN2 also rises at the same time as rising of the input IN1 without the delay time T, and a timing of rising of the output of the inverter INV when the input IN1 also rises at the same time as rising of the input IN2 (with the rising of the input IN1 delayed by the time T).

Alternatively, each of the timing difference division circuits 81 to 88 in FIG. 3 may have a configuration in FIG. 7 in which each of constant current sources CS1 and CS2 is constituted from a source of a constant current having a same value (constant current source of the current having a fixed value) and which omits a control signal ict1.

In the example described above, the clock signals for edge detection are generated by interpolating the outputs of the interpolators that generate the data latch clock signals, and the fourth-phase clock signals from the interpolators $30_1$ and $30_2$ can be used as the data latch clock signals. Accordingly, sampling phases of the even-numbered data and the odd-numbered data can be controlled separately.

The foregoing description was given in connection with the example described above. The present invention is not limited to the configuration of the example described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit, comprising:
   a four-phase clock generation circuit which generates clock signals of four phases equally spaced by 90 degrees;
   a first interpolator which receives the clock signals with first and third phases of the four phases, performs phase interpolation, and generates a signal obtained by the interpolation and a signal with a phase reverse to a phase of the signal obtained by the interpolation;
   a second interpolator which receives the clock signals with second and fourth phases of the four phases, performs phase interpolation, and generates a signal obtained by the interpolation and a signal with a phase reverse to a phase of the signal obtained by the interpolation;
   a control circuit which controls each of phase interpolating amounts of said first and second interpolators separately, a duty ratio correction being separately carried out in a response to respective changes in duty ratios of the even data and the odd data; and
   a four-phase-to-eight-phase conversion circuit which receives the four-phase clock signals from said first and second interpolators, buffers the four-phase clock signals from said first and second interpolators and delivers the buffered four-phase clock signals without alteration, and generates four-phase clock signals obtained by interpolating two of the clock signals having the mutually adjacent phases among the four-phase clock signals output from said first and second interpolators, thereby providing eight-phase clock signals,
   a set of the four-phase clock signals among the eight-phase clock signals from said four-phase-to-eight-phase conversion circuit being used for data detection of serial data and the remaining four-phase clock signals being used for edge detection of the serial data, the serial data having even data and odd data multiplexed therein, for transfer.

2. The clock and data recovery circuit according to claim 1, wherein said four-phase-to-eight-phase conversion circuit comprises:
first through fourth buffer circuits which buffer the four-phase clock signals from said first and second interpolators and output the buffered four-phase clock signals without alteration, respectively; and
first through fourth timing division circuits which generate the clock signals each obtained by equally dividing a timing difference between the two clock signals having the mutually adjacent phases among the four-phase clock signals from said first and second interpolators.

3. The clock and data recovery circuit according to claim 2, wherein said first through fourth buffer circuits which buffer and output the four-phase clock signals from said first and second interpolators without alteration, respectively, comprise fifth through eighth timing division circuits, respectively, said fifth through eighth timing division circuits receiving the four-phase clock signals from said first and second interpolator, respectively, at respective two input terminals thereof in common.

4. The clock and data recovery circuit according to claim 1, further comprising:
a first selector which receives from among the four-phase clock signals from said four-phase clock generation circuit the clock signals with the first phase and the third phase, and selects one of the clock signals with the first phase and the third phase based on a first selection signal, for supply to a first input of said first interpolator;
a second selector which receives from among the four-phase clock signals the clock signals with the second phase and the fourth phase, and selects one of the clock signals with the second phase and the fourth phase based on a second selection signal, for supply to a second input of said first interpolator;
a third selector which receives from among the four-phase clock signals from said four-phase clock generation circuit the clock signals with the first phase and the third phase, and selects one of the clock signals with the first phase and the third phase based on the first selection signal, for supply to a first input of said second interpolator; and
a fourth selector which receives from among the four-phase clock signals from said four-phase clock generation circuit the clock signals with the second phase and the fourth phase, and selects one of the clock signals with the second phase and the fourth phase based on the second selection signal, for supply to a second input of said second interpolator.

5. The clock and data recovery circuit according to claim 4, further comprising:
first through eighth latches which latch the serial data responsive to the eight-phase clock signals from said four phase-to eight-phase conversion circuit, respectively;
a digital filter which receives latched results of the first through eighth latches and outputs an up or down signal based on a result of filter processing of the latched results; and
a control circuit which receives the up or down signal from the digital filter and generates said first and second selection signals and generates first and second control signals for controlling respective phase interpolating amounts of said first and second interpolators separately.

6. The clock and recovery circuit of claim 1, wherein said four-phase-to-eight-phase conversion circuit comprises a plurality of timing difference division circuits, each said timing difference division circuit receiving two signals as inputs, said two signals being signals from said first set of clock signals.

7. The clock and recovery circuit of claim 6, wherein:
said plurality of timing difference division circuits comprise eight circuits,
said two input signals are both a same signal from said first set of clock signals for four of said eight circuits, and
said two input signals comprise said mutually adjacent phases of said first set of clock signals for four other of said eight circuits.

8. The clock and recovery circuit of claim 6, wherein each said timing difference division circuit comprises two MOS transistors, each respectively receiving one of said input signals at a gate thereof.

9. A clock and data recovery circuit, comprising:
a plurality of interpolators respectively configured to receive two input clock signals and to generate a clock signal with a phase obtained by interpolating a phase difference between the two input signals, a plurality of clock signals being output from the respective interpolators constituting a first set of clock signals;
a conversion circuit coupled to the interpolators to receive the first set of clock signals, to generate a second set of clock signals obtained by dividing mutually adjacent phases of the first set of clock signals, and to output the first set of clock signals and the second set of the clock signals;
a first plurality of latches coupled to the conversion circuit to latch input data respectively in response to the first set of clock signals and to output respective latched data;
a second plurality of latches coupled to the conversion circuit to latch the input data respectively in response to the second set of clock signals and to output respective latched results; and
a control circuit coupled to the interpolators and the first and second plurality of latches to control phase interpolating amounts of the respective interpolators separately based on the respective latched data and the respective latched result.

10. The clock and data recovery circuit according to claim 9, wherein the input data comprises serial data in which even data and odd data are multiplexed.

11. The clock and data recovery circuit according to claim 10, wherein the first plurality of latches latch the even data and the odd data, and the second plurality of latches performs an edge detection of the input data by latching the input data.

* * * * *